(12) United States Patent  
Furuichi

(10) Patent No.: US 9,108,320 B2  
(45) Date of Patent: Aug. 18, 2015

(54) SUCTION STRUCTURE, ROBOT HAND AND ROBOT

(71) Applicant: KABUSHIKI KAISHA YASKAWA DENKI, Kitakyushu-shi (JP)

(72) Inventor: Masatoshi Furuichi, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 14/324,244

(22) Filed: Jul. 7, 2014

(65) Prior Publication Data

US 2015/0015014 A1 Jan. 15, 2015

(30) Foreign Application Priority Data

Jul. 8, 2013 (JP) ................. 2013-142875

(51) Int. Cl.
*B25J 15/06* (2006.01)
*H01L 21/677* (2006.01)
*H01L 21/683* (2006.01)

(52) U.S. Cl.
CPC ....... *B25J 15/0616* (2013.01); *H01L 21/67766* (2013.01); *H01L 21/6838* (2013.01); *Y10S 414/141* (2013.01); *Y10S 901/40* (2013.01)

(58) Field of Classification Search
CPC ........... B25J 15/0616; H01L 21/67766; H01L 21/6838; Y10S 414/141; Y10S 901/40
USPC .................. 294/183, 188, 189, 213; 414/941; 901/40
See application file for complete search history.

(56) References Cited

U.S. PATENT DOCUMENTS

| | | | | |
|---|---|---|---|---|
| 3,152,828 | A * | 10/1964 | Lytle | 294/189 |
| 4,529,353 | A * | 7/1985 | Dean et al. | 414/810 |
| 5,172,922 | A * | 12/1992 | Kowaleski et al. | 279/3 |
| 5,582,450 | A * | 12/1996 | Nagai et al. | 294/189 |
| 6,942,265 | B1 * | 9/2005 | Boyd et al. | 294/189 |
| 7,055,875 | B2 * | 6/2006 | Bonora et al. | 294/188 |
| 2008/0025824 | A1 | 1/2008 | Hashimoto | |
| 2012/0235335 | A1 * | 9/2012 | Hayashi et al. | 269/21 |

FOREIGN PATENT DOCUMENTS

JP 2008-028134 2/2008

* cited by examiner

*Primary Examiner* — Dean Kramer  
(74) *Attorney, Agent, or Firm* — Mori & Ward, LLP

(57) ABSTRACT

A suction structure includes a fixing base, a pad fixed to the fixing base and a seal member arranged between the pad and the fixing base. The pad includes a contact portion arranged to make contact with a target object to be sucked, a space surrounded by the contact portion, a suction hole through which the space communicates with a vacuum source via the seal member, and one or more support portions fixing the pad to the fixing base. Each of the support portions is arranged on an axis of tilting movement, and being provided with a twist portion for supporting the contact portion such that the contact portion makes the tilting movement about the axis.

20 Claims, 8 Drawing Sheets

SUCTION STRUCTURE, ROBOT HAND AND ROBOT

CROSS-REFERENCE TO RELATED APPLICATION

The present disclosure contains subject matter related to that disclosed in Japanese Priority Patent Application No. 2013-142875 filed with the Japan Patent Office on Jul. 8, 2013, the entire contents of which are incorporated herein by reference.

BACKGROUND OF THE INVENTION

1. Field of the Invention

An embodiment disclosed herein relates to a suction structure, a robot hand and a robot.

2. Description of the Related Art

In the related art, there is known a substrate transfer robot that transfers a thin substrate such as a wafer or a glass substrate (see, e.g., Japanese Patent Application Publication No. 2008-28134).

The robot includes, e.g., an arm and a robot hand (hereinafter referred to as a "hand") installed to a distal end portion of the arm. The robot transfers a substrate by operating the arm in a horizontal direction and other directions, while allowing the hand to hold the substrate.

In the course of transferring the substrate, it is necessary to reliably hold the substrate and to prevent position shift of the substrate. Thus, there is proposed a robot which includes a hand having a suction structure using a vacuum pad or the like and which holds a substrate during the transfer thereof by causing the suction structure to suck the substrate.

If the robot is used in a semiconductor manufacturing process, a substrate undergoes a thermal treatment process such as a film formation process or the like. Therefore, the robot often transfers a substrate heated to a high temperature in the thermal treatment process.

SUMMARY OF THE INVENTION

In accordance with an aspect of the embodiment, there is provided a suction structure including a fixing base, a pad and a seal member. The pad includes a contact portion which makes contact with a target object to be sucked, a space surrounded by the contact portion, a suction hole and one or more support portions, each of the support portions having a twist portion. The support portions fix the pad to the fixing base and each of the support portions is arranged on an axis of tilting movement. The twist portion supports the contact portion such that the contact portion makes the tilting movement about the axis. The seal member is arranged between the pad and the fixing base. The suction hole makes the space communicate with a vacuum source through the seal member.

DESCRIPTION OF THE EMBODIMENTS

An embodiment of a suction structure, a robot hand and a robot will now be described in detail with reference to the accompanying drawings. The present disclosure is not limited to the embodiment.

Hereinafter, description will be made by taking, as an example, a case where the robot is a substrate transfer robot for transferring a wafer as a target object. The wafer is designated by reference symbol "W". In the following description, each of the rigid elements which constitute a mechanical structure and which can make movement relative to each other will be referred to as a "link". The "link" will be often referred to as an "arm".

Figure 1:
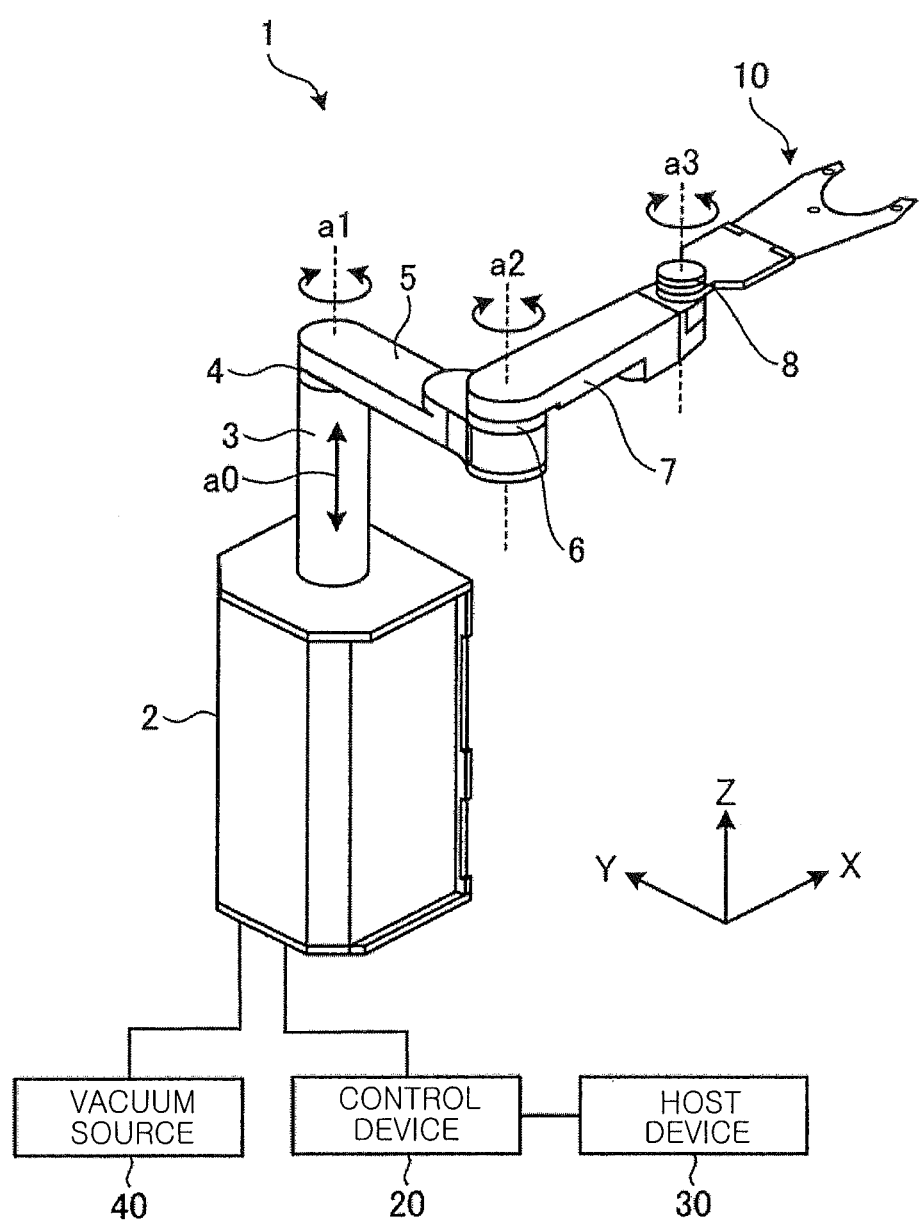
FIG. 1 is a schematic perspective view of a robot according to an embodiment.

First, the configuration of a robot 1 according to the embodiment will be described with reference to FIG. 1. FIG. 1 is a schematic perspective view of the robot 1 according to the embodiment.

For the sake of easy understanding, a three-dimensional rectangular coordinate system including a Z-axis whose positive direction extends vertically upward and whose negative direction extends vertically downward is indicated in FIG. 1. The direction extending along an X-Y plane designates a "horizontal direction". This rectangular coordinate system is sometimes indicated in other drawings used in the following description.

In the following description, for the purpose of convenience in description, the positional relationship between the respective parts of the robot 1 will be described under the assumption that the swing position of the robot 1 and the orientation thereof are in the states shown in FIG. 1.

In the following description, it is sometimes the case that, with respect to a plurality of components, some are designated by reference symbols with the others not given any reference symbol. In this case, it is assumed that some of the components designated by the reference symbols are identical in configuration with the remaining components.

As shown in FIG. 1, the robot 1 includes a base 2, a lifting and lowering unit 3, and an arm unit having a first joint unit 4, a first arm 5, a second joint unit 6, a second arm 7, a third joint unit 8 and a hand 10.

The base 2 is a base unit of the robot 1 and is fixed to a floor surface or a wall surface. In some case, the robot 1 is fixed to another device by using the upper surface of the base 2. The lifting and lowering unit 3 is installed so that it can slide in a vertical direction (a Z-axis direction) with respect to the base 2 (see a double-head arrow a0 in FIG. 1). The lifting and lowering unit 3 moves the arm unit of the robot 1 up and down along the vertical direction.

The first joint unit 4 is a rotary joint rotatable about an axis a1. The first arm 5 is rotatably connected to the lifting and lowering unit 3 through the first joint unit 4 (see a double-head arrow around the axis a1 in FIG. 1).

The second joint unit 6 is a rotary joint rotatable about an axis a2. The second arm 7 is rotatably connected to the first arm 5 through the second joint unit 6 (see a double-head arrow around the axis a2 in FIG. 1).

The third joint unit 8 is a rotary joint rotatable about an axis a3. The hand 10 is rotatably connected to the second arm 7 through the third joint unit 8 (see a double-head arrow around the axis a3 in FIG. 1).

The robot 1 is equipped with a drive source (not shown) such as a motor or the like. Each of the first joint unit 4, the second joint unit 6 and the third joint unit 8 is rotated by the operation of the drive source.

The hand 10 is an end effector that vacuum-sucks and holds a wafer W. Details of the configuration of the hand 10 will be described later with reference to FIG. 2 and the following figures. In FIG. 1, there is shown a case where the robot 1 is provided with one hand 10. However, the number of the hand 10 is not limited thereto.

For example, a plurality of hands 10 may be installed in an overlapping relationship to have the axis a3 as an rotation axis so that the hands 10 can independently rotate about the axis a3.

The robot 1 transfers a wafer W with the combination of the up/down operation of the lifting and lowering unit 3 and the rotating operations of the respective arms 5 and 7 and the hand 10. These operations are performed by the instructions from a control device 20 which is connected to the robot 1 through a communication network so that they can make communication with each other.

The control device 20 is a controller that controls the operation of the robot 1. For instance, the control device 20 instructs the operation of the aforementioned drive source. Responsive to the instruction transmitted from the control device 20, the robot 1 rotates the drive source by an arbitrary angle, thereby rotating the arm unit.

This operation control is performed based on teaching data stored in the control device 20 in advance. However, there may be a case where the teaching data are obtained from a host device 30 connected to the control device 20 so that they can make communication with each other.

Figure 2:
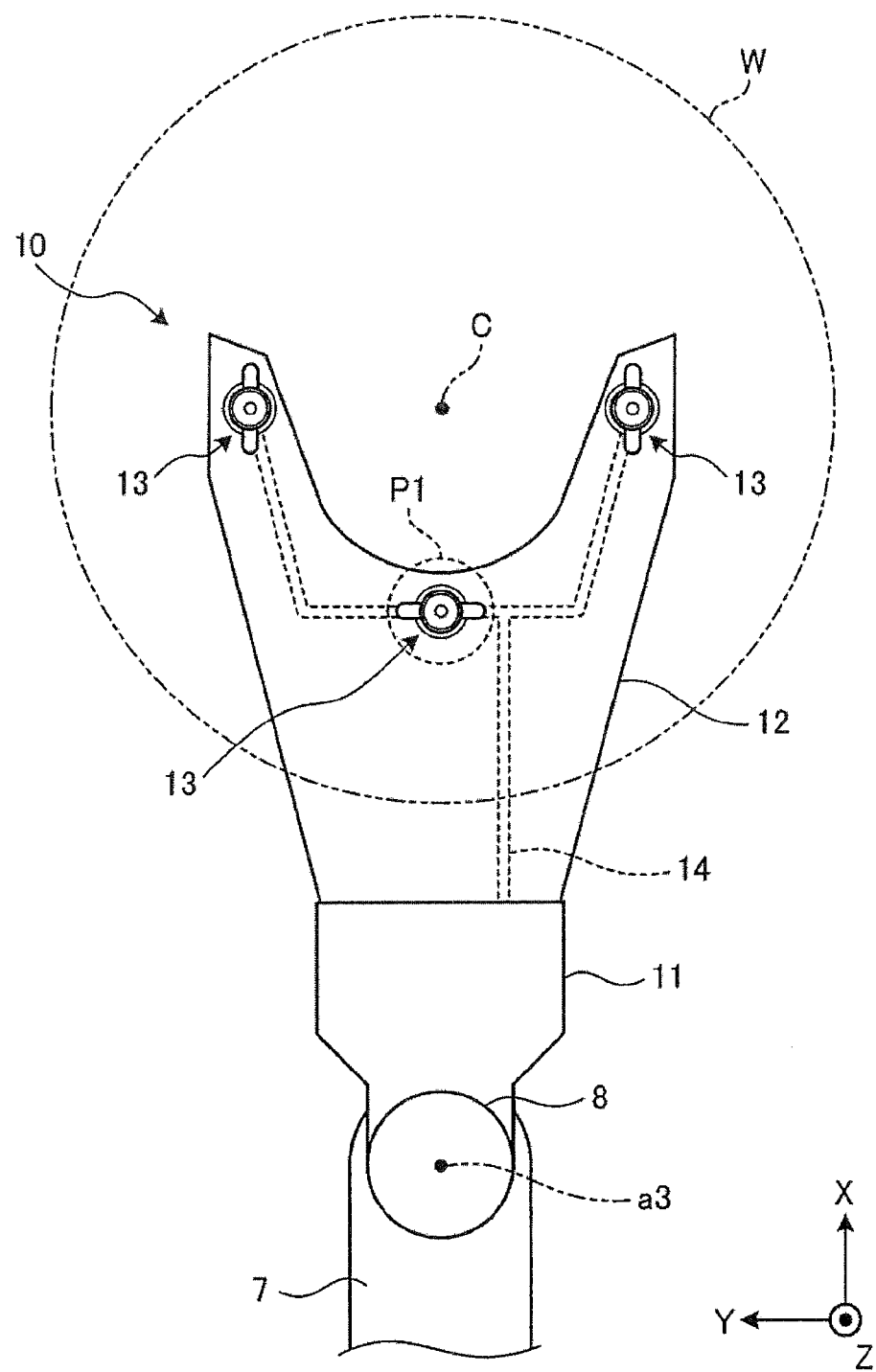
FIG. 2 is a schematic plan view of a hand.

Next, the configuration of the hand 10 will be described with reference to FIG. 2. FIG. 2 is a schematic plan view of the hand 10. In FIG. 2, the wafer W in a normal position is indicated by a double-dot chain line. In this regard, the normal position refers to a position where the wafer W is ideally located. In the following description, the center of the wafer W in the normal position will be designated by reference symbol "C".

As shown in FIG. 2, the hand 10 is installed in the distal end portion of the second arm 7 through the third joint unit 8 so as to rotate about the axis a3. The hand 10 includes a plate holder 11, a plate 12, pads 13 and a vacuum path 14.

The plate holder 11 is connected to the third joint unit 8 and is configured to hold the plate 12. The plate 12 is a member serving as a base of the hand 10 and is made of ceramic or the like. In FIG. 2, there is illustrated the plate 12 whose distal end portion has a bifurcated shape, but the shape of the plate 12 is not limited thereto.

The pads 13 are members that vacuum-suck the wafer W to hold the wafer W on the hand 10. In the present embodiment, three pads 13 are installed in the positions shown in FIG. 2 and are configured to suck and hold the wafer W at three points. The number of the pads 13 is not limited to three and may be, e.g., more than three. The configuration of each of the pads 13 will be described in detail with reference to FIG. 3A and the ensuing figures.

The vacuum path 14 is a suction route that extends from the respective pads 13 to a vacuum source 40. For example, as shown in FIG. 2, the vacuum path 14 is formed within the plate 12. As the wafer W is placed on the pads 13, the vacuum source 40 performs sucking through the vacuum path 14 and the wafer W is sucked to the pads 13. The vacuum path 14 may be formed in any position insofar as the vacuum path 14 enables the vacuum source to perform sucking.

Examples of the shape of a warped wafer W includes a so-called "dome shape" in which the wafer W is gradually curving upward toward the center C, a so-called "bowl shape" in which the wafer W is gradually curving downward toward the center C, and a random shape in which the wafer W has the dome shape and the bowl shape in combination. However, in reality, it will be sufficient to assume that one of the "dome shape" and the "bowl shape" is generated in the local area of the wafer W on each of the pads 13. For that reason, the behavior of each of the pads 13 will now be described by taking, as an example, a case where the warped wafer W has the "dome shape" or the "bowl shape".

That is to say, it can be said that the wafer W takes a warped shape having a deflection curve extending in a radial direction thereof. In the present embodiment, even if the wafer W is warped, the pads 13 are made to conform to the warped wafer W, thereby reliably vacuum-sucking the wafer W.

Next, the configuration of each of the pads 13 will be described in detail. In the following description, among the pads 13 shown in FIG. 2, only the pad 13 surrounded by a closed curve P1 will be taken as a primary example.

Figure 3A:
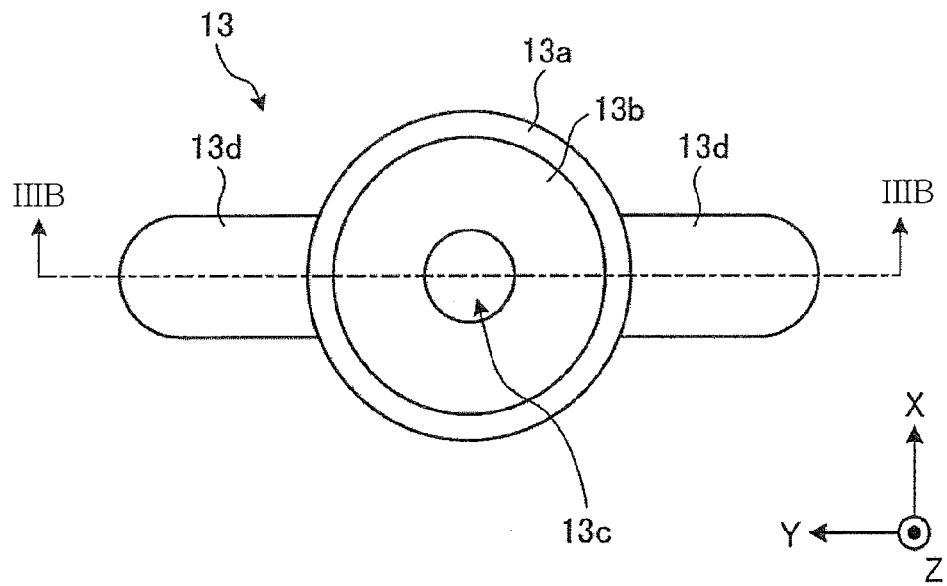
FIG. 3A is a schematic plan view of a pad.
Figure 3B:
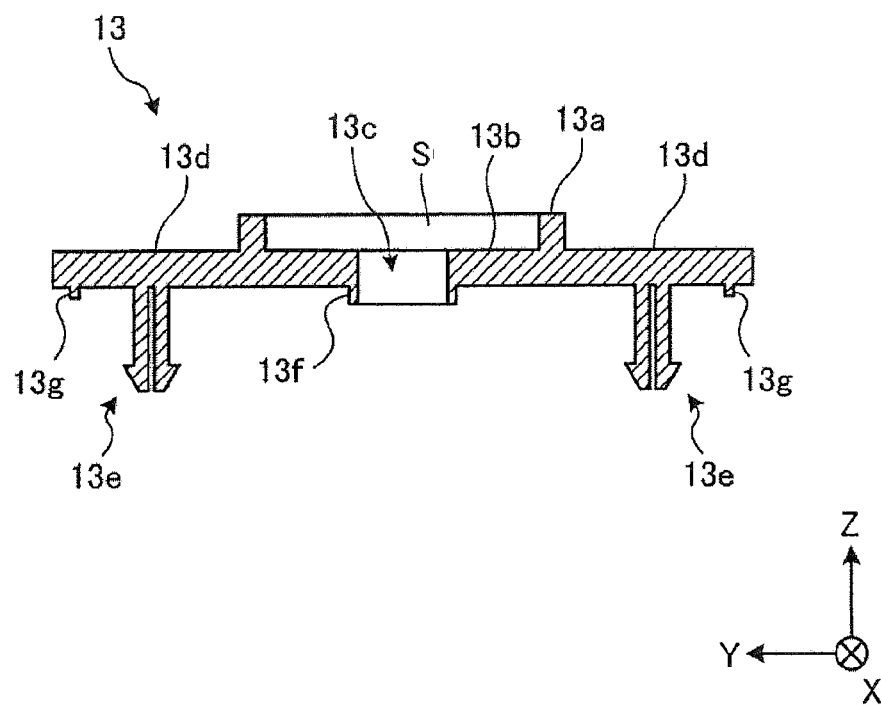
FIG. 3B is a schematic sectional view taken along the line IIIB-IIIB in FIG. 3A.

FIG. 3A is a schematic plan view of the pad 13. FIG. 3B is a schematic sectional view taken along the line IIIB-IIIB in FIG. 3A. As shown in FIG. 3A, the pad 13 includes a contact portion 13a, a major surface portion 13b, a suction hole 13c, and two support portions 13d arranged at the opposite sides of the contact portion 13a and the major surface portion 13b in the illustrated example. The number of the support portions 13d is not limited to two.

As shown in FIG. 3B, the pad 13 further includes fixing portions 13e, a first protrusion portion 13f and a second protrusion portion 13g.

The pad 13 may be made of various kinds of materials such as a resin and the like. For example, it is preferred that the material of the pad 13 has flexibility in order for the pad 13 to conform to the deformation of the wafer W.

Since the pad 13 may make contact with a wafer W heated to be a high temperature, it is preferred that the material of the pad 13 is superior in heat resistance. As one example, a polyimide resin or the like can be suitably used as the material of the pad 13. In the present embodiment, it is assumed that the pad 13 is one-piece molded using a polyimide resin.

The contact portion 13a is a portion that makes contact with a wafer W as the target object to be sucked. The major surface portion 13b is a portion that serves as a so-called base plate of the pad 13. The outer periphery of the major surface portion 13b is surrounded by the contact portion 13a. In FIG. 3A, there is illustrated the major surface portion 13b having a substantially circular shape, but the shape of the major surface portion 13b is not limited thereto.

The suction hole 13c is formed in the central region of the major surface portion 13b. The suction hole 13c brings a space S surrounded by the contact portion 13a into communication with the vacuum source 40 through a seal member 15 (see FIGS. 4A and 4B). The support portions 13d, each of which is provided with the fixing portion 13e and the second protrusion portion 13g, are portions that fix the pad 13 to the plate 12. The support portions 13d are arranged on an axis ax about which the contact portion 13a makes tilting movement (see FIG. 5B).

The fixing portion 13e is a portion that protrudes from each of the support portions 13d toward the plate 12. The fixing portion 13e has a split leading end portion and the split leading end portion is provided with a lug serving as a hook. It is preferred that the fixing portion 13e has elasticity to make the split leading end portion expand in the free state. Thus, the pad 13 is fixed by inserting the fixing portions 13e into corresponding through-holes formed in the plate 12.

The first protrusion portion 13f is a protrusion portion for positioning the seal member 15 (see FIGS. 4A and 4B) to be described later. More specifically, the first protrusion portion 13f makes contact with the seal member 15 to restrict the position of the seal member 15. The second protrusion portions 13g are protrusion portions for preventing misalignment of the pad 13.

Figure 4A:
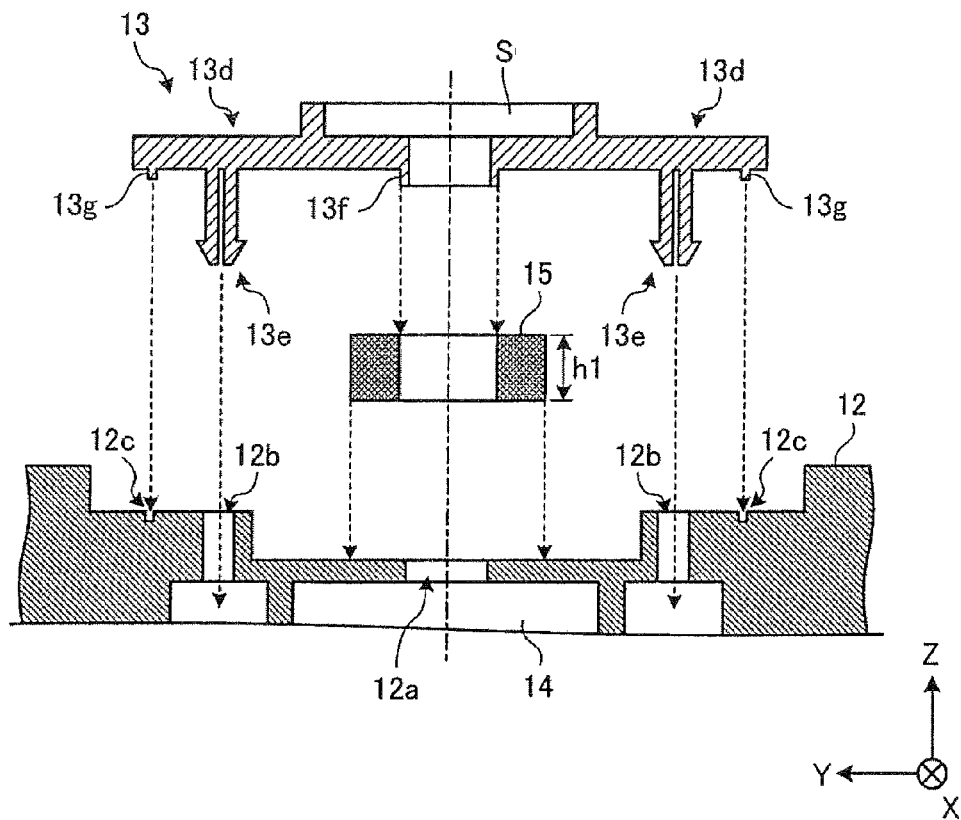
FIG. 4A is a schematic sectional view before the pad is fixed to a fixing base showing an attachment structure of the pad.
Figure 4B:
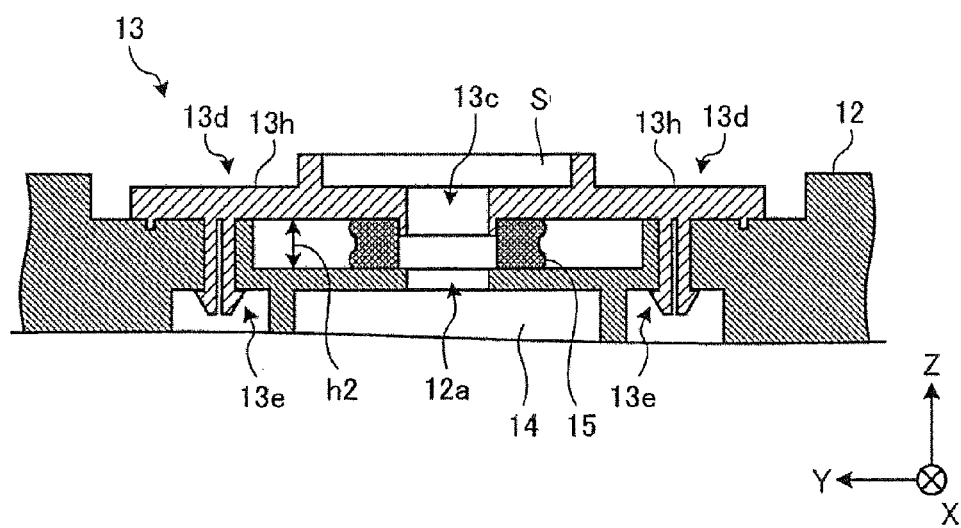
FIG. 4B is a schematic sectional view after the pad is fixed to the fixing base showing the attachment structure of the pad.

Next, description will be made on the attachment structure of the pad 13. FIGS. 4A and 4B are schematic sectional views showing the attachment structure of the pad 13, which are taken along the line IIIB-IIIB in FIG. 3A.

As shown in FIG. 4A, a suction hole 12a communicating with the vacuum path 14, through-holes 12b corresponding to the fixing portions 13e and engagement holes 12c engaging with the second protrusion portions 13g are formed in the plate 12 in advance. That is to say, the plate 12 is a fixing base of the suction structure according to the present embodiment.

The seal member 15 is arranged between the pad 13 and the plate 12 and substantially supports the contact portion 13a of the pad 13. The seal member 15 is an elastic body formed into a substantially cylindrical shape and is made of, e.g., a silicon resin or the like.

The seal member 15 has an inner diameter such that the inner circumferential surface makes close contact with the outer circumferential surface of the first protrusion portion 13f. Moreover, the seal member 15 has a height h1 larger than a gap h2 (see FIG. 4B) between the pad 13 and the plate 12 in the attachment region of the seal member 15.

The pad 13 is attached to the plate 12 by inserting the fixing portions 13e into the corresponding through-holes 12b while allowing the outer circumferential surface of the first protrusion portion 13f to engage with the inner circumferential surface of the seal member 15 and allowing the second protrusion portions 13g to engage with the corresponding engagement holes 12c.

As shown in FIG. 4B, the fixing portion 13e has the split leading end portion with the lug serving as a hook. Thus, the pad 13 can be attached to the plate 12 without having to use any tool. That is to say, the pad 13 can be easily attached to the plate 12. This enables an end user to efficiently perform a replacement work on the spot.

Since the pad 13 can be attached to the plate 12 without having to use an adhesive agent, it is possible to prevent an organic substance contained in an adhesive agent from being volatilized and adversely affecting a product when the wafer W is hot.

The seal member 15 has the height h1 larger than the gap h2 between the pad 13 and the plate 12 in the attachment region of the seal member 15. Therefore, when the pad 13 is fixed to the plate 12, the seal member 15 is compressed in a crushed state. This makes it possible to reliably seal a clearance between the suction holes 13c and 12a and to secure an air-tight space.

In FIGS. 4A and 4B, there is illustrated a case where the protrusion portions 13f and 13g are provided to the pad 13. Needless to say, the protrusion portions 13f and 13g may be provided to the plate 12.

In the present embodiment, the suction structure includes twist portions 13h for supporting the contact portion 13a such that the contact portion 13a and the major surface portion 13b make tilting movement about the axis ax on which the support portions 13d are arranged. On this point, description will be made later with reference to FIG. 5B.

Figure 5A:
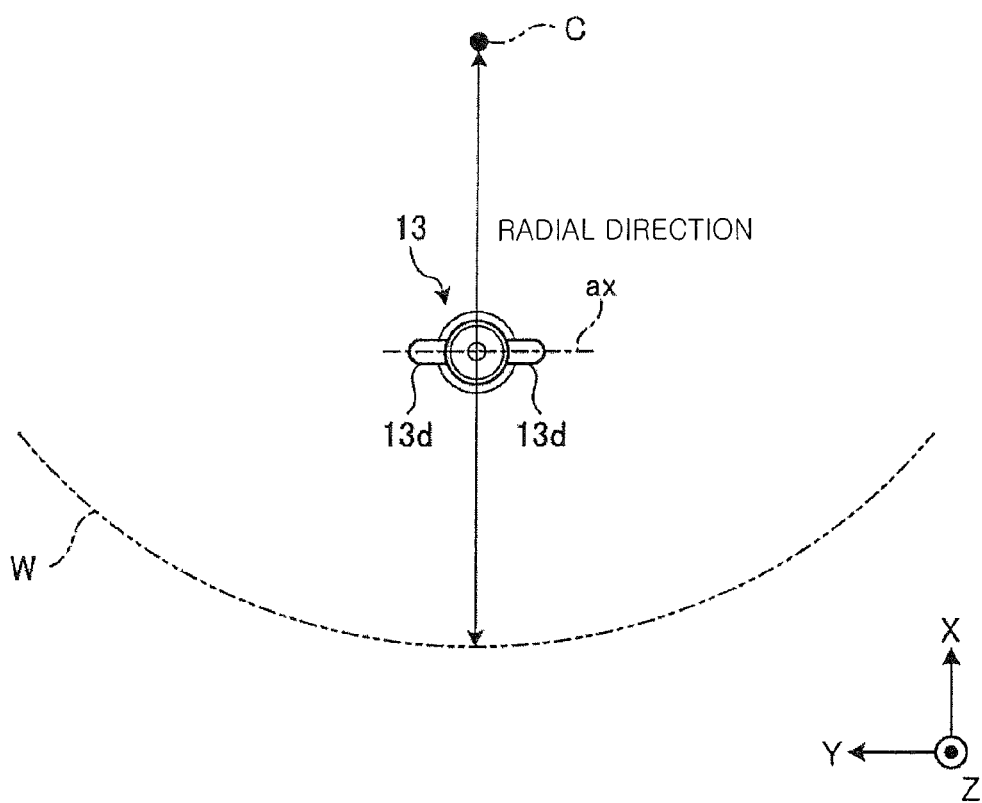
FIG. 5A is a schematic plan view showing an arrangement example of the pad.
Figure 5B:
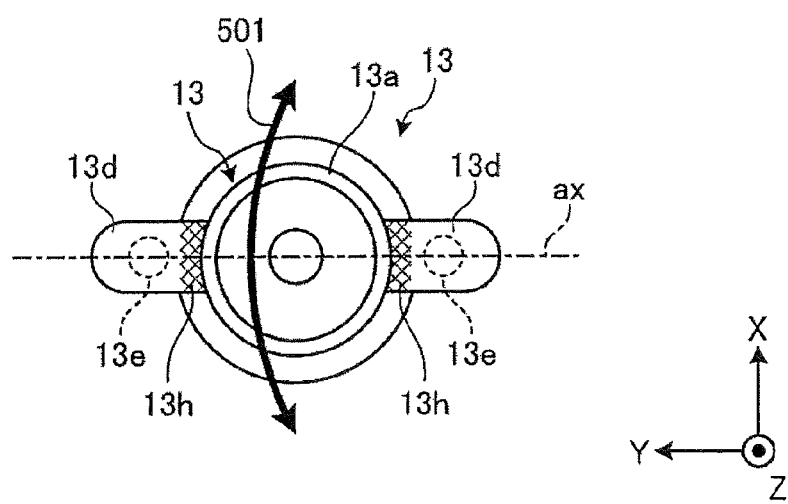
FIG. 5B is a schematic plan view showing the movement of the pad.

Next, description will be made on an arrangement example of the pad 13 and the movement of the pad 13. FIG. 5A is a schematic plan view showing an arrangement example of the pad 13. FIG. 5B is a schematic plan view showing the movement of the pad 13.

As shown in FIG. 5A, for example, the pad 13 is arranged in such an orientation that the axis ax of tilting movement is substantially orthogonal to the radial direction of the wafer W in the normal position which extends through the center of the pad 13. In other words, the pad 13 is arranged such that the axis ax of tilting movement is tangential to an imaginary circle drawn about the center C of the wafer W in the normal position.

Thus, with respect to the wafer W having a radially warped shape such as a dome shape or a bowl shape, the contact portion 13a can easily make tilting movement about the axis ax substantially orthogonal to the radial direction. For that reason, even if the wafer W is warped, the pad 13 can easily conform to the warped wafer W.

As shown in FIG. 5B, one end of each of the support portions 13d is fixed to the plate 12 by the fixing portion 13e. The twist portion 13h for supporting the contact portion 13a such that the contact portion 13a can make tilting movement about the axis ax is arranged at the other end of each of the support portions 13d. Thus, the contact portion 13a can make tilting movement about the axis ax by twisting the other end of each of the support portions 13d (see an arrow 501 in FIG. 5B). The flexibility of the pad 13 and the elasticity of the seal member 15 synergistically act in generating a twisting force at this time.

This enables the contact portion 13a to make tilting movement about the axis ax. Therefore, even if the wafer W is warped, the pad 13 can easily conform to the warped wafer W. That is to say, it is possible to reliably suck the wafer W.

Figure 6A:
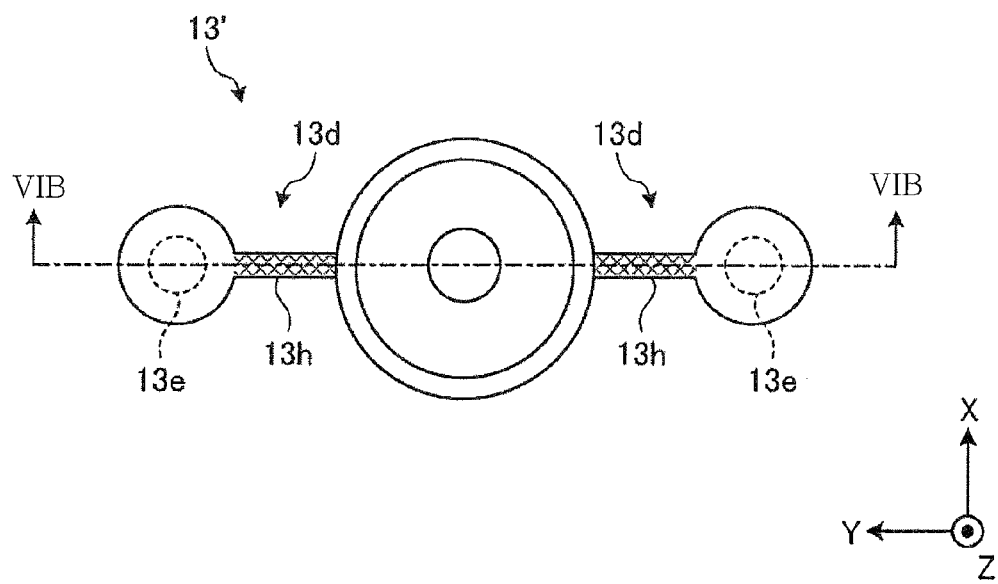
FIG. 6A is a schematic plan view of a pad according to a first modified example.
Figure 6B:
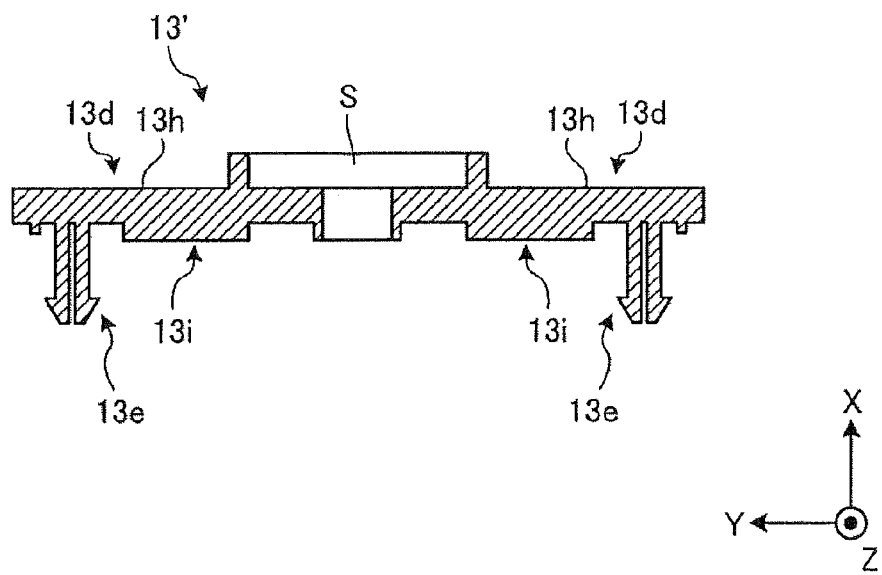
FIG. 6B is a schematic sectional view taken along the line VIB-VIB in FIG. 6A.

The shape of the pad 13 and the method of fixing the pad 13 are not limited to the example described above. Next, modified examples of the pad 13 will be described with reference to FIGS. 6A to 6E. The example shown in FIGS. 6A and 6B is a first modified example. The examples shown in FIGS. 6C to 6E relates to a second modified example.

FIG. 6A is a schematic plan view of a pad 13' according to the first modified example. FIG. 6B is a schematic sectional view taken along the line VIB-VIB in FIG. 6A.

The pad 13' according to the first modified example remains the same as the aforementioned pad 13 in that the pad 13' is provided with the support portions 13d arranged on the axis ax of tilting movement. However, the pad 13' according to the first modified example differs from the aforementioned pad 13 in that both end portions of each of the support portions 13d are different in width from each other in a plan view, as shown in FIG. 6A.

More specifically, as shown in FIG. 6A, the pad 13' includes one end portion (a fixing portion 13e and its vicinity) and the other end portion (a twist portion 13h) smaller in width than the one end portion. Thus, the twist portion 13h is smaller in rigidity than the remaining portion of each of the support portions 13d.

That is to say, the twist portion 13h is easily twisted and the contact portion 13a can easily make tilting movement. Therefore, even if the wafer W is warped, the pad 13 can easily conform to the warped wafer W. As a result, it is possible to reliably suck the wafer W.

When enabling the contact portion 13a to make tilting movement with ease, it is preferable to reliably crush and compress the seal member 15 such that a position shift does not occur due to the tilting movement. Thus, as shown in FIG. 6B, a rib portion 13i may be formed to protrude from the twist portion 13h toward the plate 12.

The rib portion 13i makes it possible to reliably crush and compress the seal member 15. Thus, it is possible to prevent the position shift of the seal member 15 and to reliably secure an air-tight space communicating with the vacuum path 14.

Figure 6C:
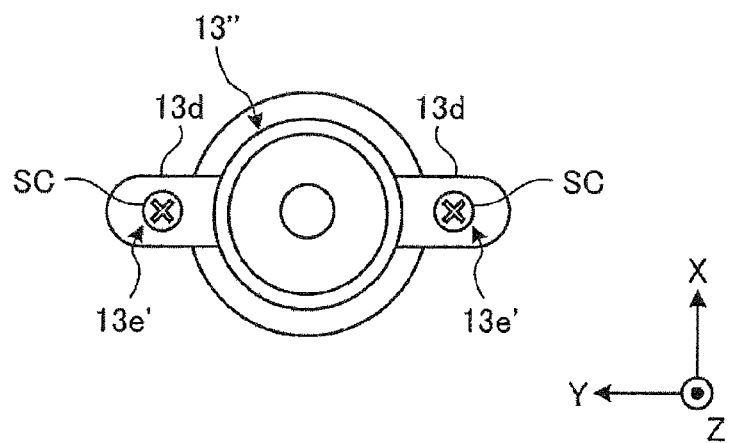
FIGS. 6C and 6D are schematic plan views showing examples of a pad according to a second modified example.
Figure 6D:
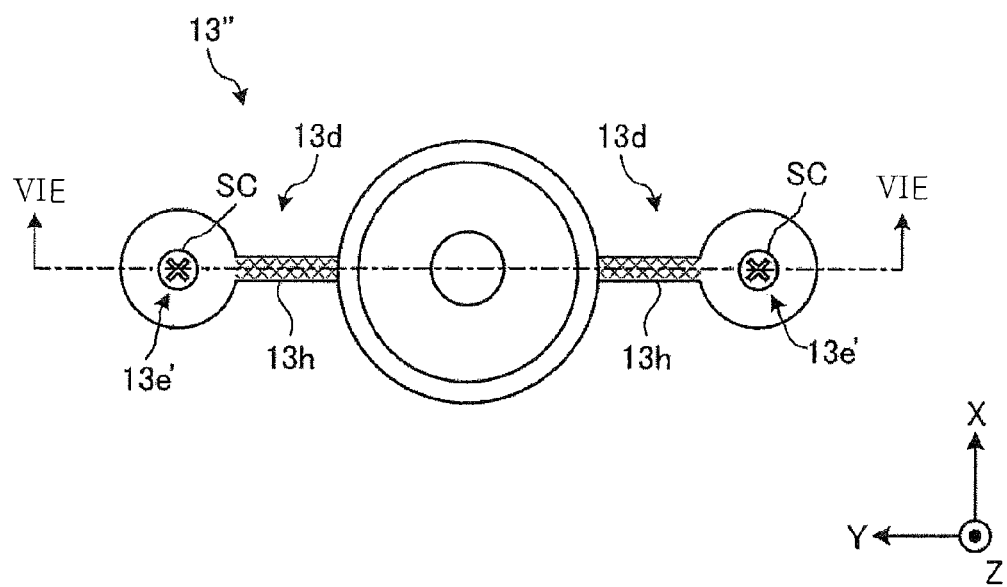
Figure 6E:
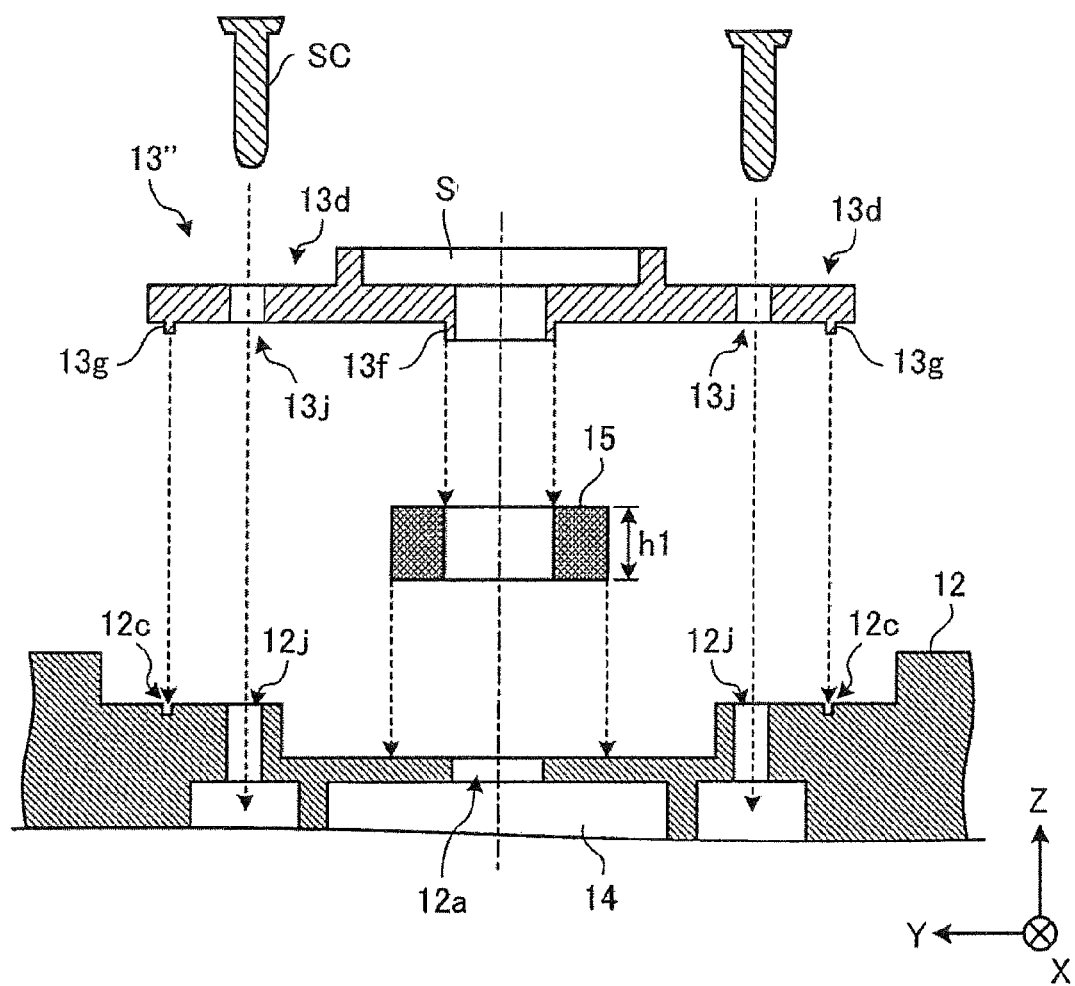
FIG. 6E is a schematic sectional view taken along the line VIE-VIE in FIG. 6D.

The foregoing description has been made by taking, as an example, a case where the fixing portion 13e is a pin-shaped fixing member with a split leading end portion. Alternatively, it may be possible to use a fastening member. FIGS. 6C and 6D are schematic plan views of examples of a pad 13" according to the second modified example. FIG. 6E is a schematic sectional view taken along the line VIE-VIE in FIG. 6D.

More specifically, as shown in FIGS. 6C and 6D, a fixing portion 13e' may be configured to fix a pad 13" using a fastening member SC such as a bolt or a screw. In this case, as shown in FIG. 6E, a through-hole 13j into which the fastening member SC is inserted is formed in each of the support portions 13d and a hole portion 12j corresponding to the through-hole 13j is formed in the plate 12. The fastening member SC inserted through the through-hole 13j of each of the support portions 13d is inserted into and fixed to the corresponding hole portion 12j of the plate 12, whereby the pad 13" is fixed to the plate 12.

Even in this case, just like the pin-shaped fixing portion 13e having the split leading end portion, the pad 13" can be easily attached without having to use an adhesive agent or the like. It is therefore possible to efficiently perform a replacement work while eliminating the influence on a product.

While not shown in the drawings, for example, a conductive wire extending from the plate holder 11 may be connected to the fixing portion 13e or the second protrusion portion 13g described above. This helps prevent the wafer W from being charged with electricity. It is therefore possible to prevent particles or the like from adhering to the wafer W.

As described above, the suction structure according to the present embodiment includes the fixing base (the plate), the pad and the seal member. The pad includes the contact portion making contact with a target object, the support portions provided with twist portions, and the suction hole. The support portions are arranged on an axis of tilting movement in the pad to fix the pad to the fixing base.

The twist portions of the support portions support the contact portion such that the contact portion can make tilting movement about the axis of tilting movement. The seal member is arranged between the pad and the fixing base. The suction hole brings the space S surrounded by the contact portion into communication with a vacuum source through the seal member.

Accordingly, the suction structure according to the present embodiment can reliably suck a warped wafer.

In the aforementioned embodiment described above, there has been taken an example where the major surface portion of the pad has a circular shape, but the present disclosure is not limited thereto. For example, the major surface portion may have an elliptical shape or an oval shape including a substantially rectangular shape with round corners. In this case, it is preferred that the pad is arranged such that the major axis direction thereof is substantially orthogonal to the radial direction of the wafer.

In the embodiment described above, there has been described a single-arm robot by way of example. However, the present disclosure may be applied to a dual-arm robot or multi-arm robots.

In the embodiment described above, there has been described an example where the target object is a wafer. However, the target object is not limited thereto but may be any thin substrate. In this regard, the kind of the substrate does not matter. The substrate may be, e.g., a glass substrate for a liquid crystal panel display.

In case of the glass substrate or the like, the aforementioned radial direction refers to a radial direction of an imaginary circle drawn about the center of the target object or a direction radially extending from the center of the target object.

The target object may not be a substrate as long as it is a thin workpiece.

In the embodiment described above, description has been made by taking, as an example, a case where the robot is a substrate transfer robot for transferring a substrate such as a wafer or the like. However, the robot may be a robot for performing a work other than a transfer work. For example, the robot may be an assembling robot that performs a specified assembling work while vacuum-sucking a thin workpiece through the use of the hand provided with the suction structure.

The number of robot arms, the number of robot hands and the number of axes are not limited by the embodiment described above.

It should be understood by those skilled in the art that various modifications, combinations, sub-combinations and alterations may occur depending on design requirements and other factors insofar as they are within the scope of the appended claims or the equivalents thereof.

What is claimed is:

1. A suction structure comprising:
   a fixing base;
   a pad fixed to the fixing base; and
   a seal member arranged between the pad and the fixing base and having elasticity,
   wherein the pad includes a contact portion arranged to make contact with a target object to be sucked, a space surrounded by the contact portion, a suction hole through which the space communicates with a vacuum source via the seal member, and one or more support portions fixing the pad to the fixing base, each of the support portions extending along an axis of tilting movement and provided with a twist portion for supporting the contact portion such that the contact portion makes the tilting movement about the axis in accordance with a twisting of the twist portion.

2. The suction structure of claim 1, wherein the seal member has a substantially cylindrical shape.

3. The suction structure of claim 2, wherein each of the support portions has a fixing portion protruding toward the fixing base and the fixing base includes a through-hole corresponding to the fixing portion, the fixing portion having a split leading end portion which is provided with a lug serving as a hook, and wherein the pad is fixed to the fixing base by inserting the fixing portion into the corresponding through-hole.

4. The suction structure of claim 3, wherein the seal member is compressed and fixed as the pad is fixed to the fixing base, and the seal member before the compression has a height larger than a gap between the pad and the fixing base along the seal member when the pad is fixed to the fixing base.

5. The suction structure of claim 2, wherein each of the support portions has a through-hole, the fixing base includes a hole portion corresponding to the through-hole, and the pad is fixed to the fixing base by inserting a fastening member through the through-hole of each of the support portion into the hole portion.

6. The suction structure of claim 5, wherein the seal member is compressed and fixed as the pad is fixed to the fixing base, and the seal member before the compression has a height larger than a gap between the pad and the fixing base along the seal member when the pad is fixed to the fixing base.

7. The suction structure of claim 2, wherein the pad further includes a protrusion portion which makes contact with the seal member to restrict a position of the seal member.

8. The suction structure of claim 1, wherein each of the support portions has a through-hole, the fixing base includes a hole portion corresponding to the through-hole, and the pad is fixed to the fixing base by inserting a fastening member through the through-hole of each of the support portion into the hole portion.

9. The suction structure of claim 8,
wherein one end portion and the other end portion of each of the support portions are different in width in a plan view, the through-hole being formed in one of the one end portion and the other end portion of each of the support portions, whichever is larger in width.

10. The suction structure of claim 8, wherein the seal member is compressed and fixed as the pad is fixed to the fixing base, and the seal member before the compression has a height larger than a gap between the pad and the fixing base along the seal member when the pad is fixed to the fixing base.

11. The suction structure of claim 1, wherein the pad further includes a protrusion portion which makes contact with the seal member to restrict a position of the seal member.

12. The suction structure of claim 1, wherein the axis of the tilting movement is substantially orthogonal to a direction radially extending from a center of the target object in a normal position.

13. A robot hand comprising the suction structure of claim 1.

14. A robot comprising the robot band of claim 13.

15. The suction structure of claim 1, wherein the one or more support portions are arranged at the opposite sides of the contact portion along the axis of tilting movement.

16. A suction structure comprising:
a fixing base;
a pad fixed to the fixing base; and
a seal member arranged between the pad and the fixing base,
wherein the pad includes a contact portion arranged to make contact with a target object to be sucked, a space surrounded by the contact portion, a suction hole through which the space communicates with a vacuum source via the seal member, and one or more support portions fixing the pad to the fixing base, each of the support portions being arranged on an axis of tilting movement and provided with a twist portion for supporting the contact portion such that the contact portion makes the tilting movement about the axis,
wherein each of the support portions has a fixing portion protruding toward the fixing base and the fixing base includes a through-hole corresponding to the fixing portion, the fixing portion having a split leading end portion which is provided with a lug serving as a hook, and
wherein the pad is fixed to the fixing base by inserting the fixing portion into the corresponding through-hole.

17. The suction structure of claim 16, wherein one end portion and the other end portion of each of the support portions are different in width in a plan view, the fixing portion being formed in one of the one end portion and the other end portion of each of the support portions, whichever is lamer in width.

18. The suction structure of claim 16, wherein the seal member is compressed and fixed as the pad is fixed to the fixing base, and the seal member before the compression has a height larger than a gap between the pad and the fixing base along the seal member when the pad is fixed to the fixing base.

19. The suction structure of claim 16, wherein the pad further includes a protrusion portion which makes contact with the seal member to restrict a position of the seal member.

20. A suction structure comprising:
a fixing base;
a pad fixed to the fixing base; and
a seal member arranged between the pad and the fixing base,
wherein the pad includes a contact portion arranged to make contact with a target object to be sucked, a space surrounded by the contact portion, a suction hole through which the space communicates with a vacuum source via the seal member, and one or more support portions fixing the pad to the fixing base, each of the support portions being arranged on an axis of tilting movement and provided with a twist portion for supporting the contact portion such that the contact portion makes the tilting movement about the axis,
wherein each of the support portions has a through-hole, the fixing base includes a hole portion corresponding to the through-hole, and the pad is fixed to the fixing base by inserting a fastening member through the through-hole of each of the support portion into the hole portion, and
wherein the pad further includes a protrusion portion which makes contact with the seal member to restrict a position of the seal member.

* * * * *